United States Patent [19]
Maesaka et al.

[11] Patent Number: 5,886,457
[45] Date of Patent: Mar. 23, 1999

[54] SEALING STRUCTURE AND METHOD OF SEALING ELECTRONIC COMPONENT

[75] Inventors: Michinobu Maesaka, Omihachiman; Jyunji Oyama, Tsuzuki-gun; Makoto Irie, Toyama; Atsushi Hirakawa, Shiga-ken, all of Japan

[73] Assignee: Murata Manufacturing Co., Ltd., Kyoto, Japan

[21] Appl. No.: 921,859

[22] Filed: Aug. 25, 1997

[30] Foreign Application Priority Data

Dec. 3, 1996 [JP] Japan ..................................... 8-339071

[51] Int. Cl.⁶ ..................................................... H01L 41/08
[52] U.S. Cl. ............................................. 310/344; 310/348
[58] Field of Search ..................................... 310/340, 346, 310/348, 344; 174/50.5, 50.52, 50.54, 50.61, 50.62, 52.1, 52.4, 52.5

[56] References Cited

U.S. PATENT DOCUMENTS 4,293,986 10/1981 Kobayashi et al. ................. 310/344 X
4,362,961 12/1982 Gerber ................................. 310/344 X
5,585,687 12/1996 Wakabayashi et al. ............. 310/344 X

FOREIGN PATENT DOCUMENTS 0156014 12/1981 Japan ..................................... 310/344

*Primary Examiner*—Mark O. Budd
*Attorney, Agent, or Firm*—Graham & James LLP

[57] ABSTRACT

A sealing structure and a sealing method for an electronic component achieves desired sealing properties and heat resistance. An electronic component element is mounted on a substrate having an electrode pattern disposed thereon, and is sealed by bonding a cap for covering the electronic component element on the substrate. An adhesive structure used to join the cap on the substrate includes a high-glass-transition-point adhesive partially coated on the cap bonded portion of the substrate, and a low-glass-transition-point adhesive coated over an entire periphery of the opening of the cap. The opening of the cap is pressed on a mounting portion of the substrate, and the adhesives are then cured to bond and seal the substrate and the cap.

10 Claims, 2 Drawing Sheets

SEALING STRUCTURE AND METHOD OF SEALING ELECTRONIC COMPONENT

BACKGROUND OF THE INVENTION

1. Field of the Invention

The present invention relates to a sealing structure and a method for sealing an electronic component, and more particularly, to a sealing structure and a method of sealing a surface mount type electronic component.

2. Description of the Related Art

A conventional electronic component known as a surface mount type electronic component, such as a piezoelectric oscillator, a piezoelectric filter, or the like, comprises a substrate having an electrode pattern disposed on an upper surface thereof, a cap and a piezoelectric element disposed in a space defined between the substrate and the cap. An electrode of the piezoelectric element is connected and bonded to the electrode pattern disposed on the substrate via a conductive adhesive. The cap is placed on the substrate to cover the piezoelectric element, and is bonded to the substrate by a sealing adhesive coated on the opening of the cap. The electrode pattern of the substrate extends outwardly from the bonded portion of the cap so that an extended portion of the electrode pattern serves as an external electrode to define a surface mount type electronic component.

In such a surface mount type electronic component, when mounting failure occurs after soldering and packaging with a printed substrate, corrective measures ranging from repair (removal) to re-soldering (manual soldering) are carried out in some cases. In re-soldering, a portion of the electronic component located near the electrode is manually heated by a soldering bit, but heat is transmitted to portions other than the electrode and creates a high-temperature portion. Generally, because a sealing adhesive is required to have flexibility, a resin adhesive having a relatively low glass transition temperature (Tg) is used. Transmission of heat having a temperature higher than the Tg of the sealing adhesive decreases adhesive strength of the sealing adhesive, and thus causes the problem of displacing or even removing the cap if an external force is applied.

To prevent this problem, a method using a sealing adhesive having a high Tg has been considered. However, a very high Tg is required, and such a sealing adhesive cannot provide other required physical properties, e.g., a desired expansion and contraction of a member in a heat shock test, thereby causing a problem of fracture, peeling or cracks. Although a high heat-resistant adhesive such as an inorganic adhesive can be used, such an adhesive cannot form a layer having a sufficient denseness to prevent penetration of a solvent during washing, and cannot provide and ensure good sealing properties.

SUMMARY OF THE INVENTION

To solve the problems described above, the preferred embodiments of the present invention provide a sealing structure and a method for sealing an electronic component which provide required sealing properties and required heat resistance.

According to a preferred embodiment of the present invention, there is provided a sealing structure for an electronic component in which an electronic component element is mounted on a substrate having an electrode pattern disposed thereon, and a cap for covering the electronic component element is bonded and sealed to the substrate, the sealing structure comprising a plurality of adhesives having different glass transition points for bonding the cap and the substrate.

In the preferred embodiments of the present invention, the cap and the substrate are bonded and sealed with a first adhesive having high heat resistance and a high Tg and a second adhesive having excellent sealing properties and a low Tg. When the electronic component is repaired and re-soldered after soldering and packaging with the printed substrate, in some cases, a soldering bit contacts the cap to heat the bonded portion of the cap to high temperature. However, because the first adhesive having a high Tg has high heat resistance, even if the bonded portion is heated to a high temperature, the adhesive strength of the sealing structure experiences very little deterioration which is substantially less deterioration as compared to prior art sealing structures. As a result, displacement and removal of the cap is prevented. Because the sealing properties in the heat shock test are ensured by the second adhesive having a low Tg, the sealing properties do not deteriorate.

Although the coating position of each of the adhesives is not limited as long as the sealing properties and adhesive force can be reliably provided, the cap and the substrate are preferably bonded and sealed by a method in which the first adhesive having high heat resistance and a high Tg is coated on the bonded portion between the cap and the substrate, and the second adhesive having excellent sealing properties and a low Tg is preferably coated over an entire periphery so as to cover the bonded portion. In this case, since the first adhesive having a high Tg is partially coated, a gap for allowing entrance and exit of air is defined when the cap is bonded.

In accordance with another preferred embodiment of the present invention, there is provided a method for sealing an electronic component in which an electronic component element is mounted on a substrate having an electrode pattern disposed thereon, and a cap for covering the electronic component element is bonded and sealed to the substrate, the sealing method comprising the steps of preparing a plurality of adhesives having different glass transition points, coating a first adhesive having a high glass transition point on a mounting portion of the substrate, coating a second adhesive having a low glass transition point on an opening of the cap, pressing the opening of the cap on the mounting portion of the substrate, curing the second adhesive having a low glass transition point and curing the first adhesive having a high glass transition point.

When the first adhesive having a high Tg is coated on a mounting portion of the substrate where the cap is bonded, and the second adhesive having a low Tg is coated on the opening of the cap, the first adhesive and the second adhesive contact each other when the cap is mounted on the substrate. At this time, if the viscosity of the uncured first adhesive is higher than that of the uncured second adhesive, the second adhesive having a low Tg is pushed away, and the opening of the cap is caused to bite into the first adhesive having the high Tg to temporarily fix the cap. The second adhesive having the low Tg spreads to surround the first adhesive having a high Tg, thereby obtaining good sealing properties.

When both adhesives are heat curable adhesives, the low-Tg adhesive and the high-Tg adhesive are preferably cured in the aforementioned order, but the low-Tg adhesive first decreases in viscosity during heating to form a fillet for wrapping the high-Tg adhesive therein, thereby obtaining more secure sealing properties.

When both adhesives are UV curable adhesives, the electronic component need not be heated, and thus it is possible to prevent the occurrence of air cavities in the cap caused by expansion of air in the cap.

The adhesives may be a combination of a heat curable adhesive and a UV curable adhesive.

For the first adhesive having a high Tg, an adhesive having a Tg higher than an evaluation temperature, for example, the temperature of the bonded portion at the time of re-soldering, is preferable. For the second adhesive having a low Tg, an adhesive having a Tg lower than the solder melting temperature may be used, but an adhesive having good flexibility is preferable for forming a dense adhesive layer which prevents penetration of a solvent during a washing step.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
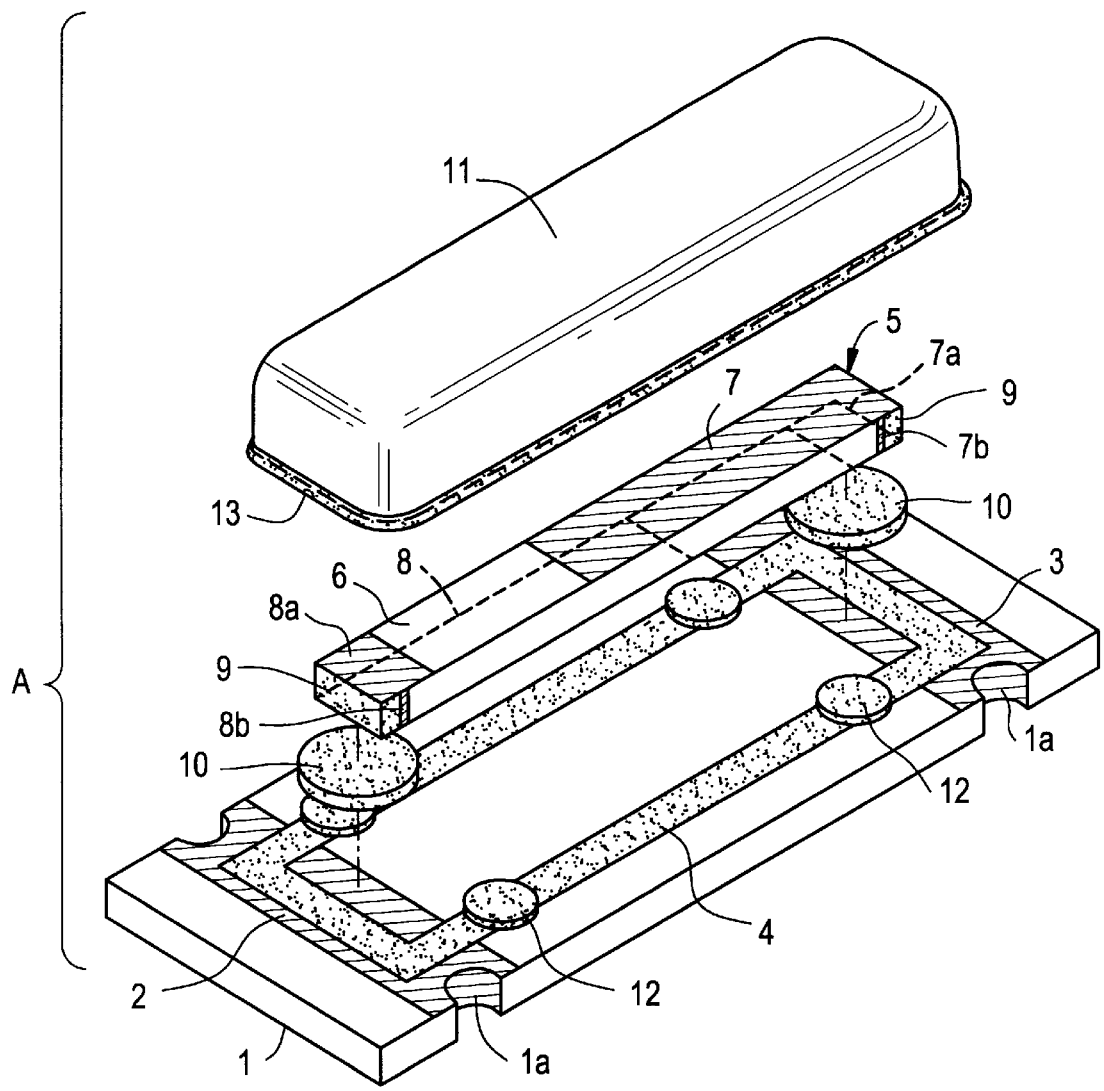
FIG. 1 is an exploded perspective view illustrating an electronic component according to a preferred embodiment of the present invention.
Figure 2:
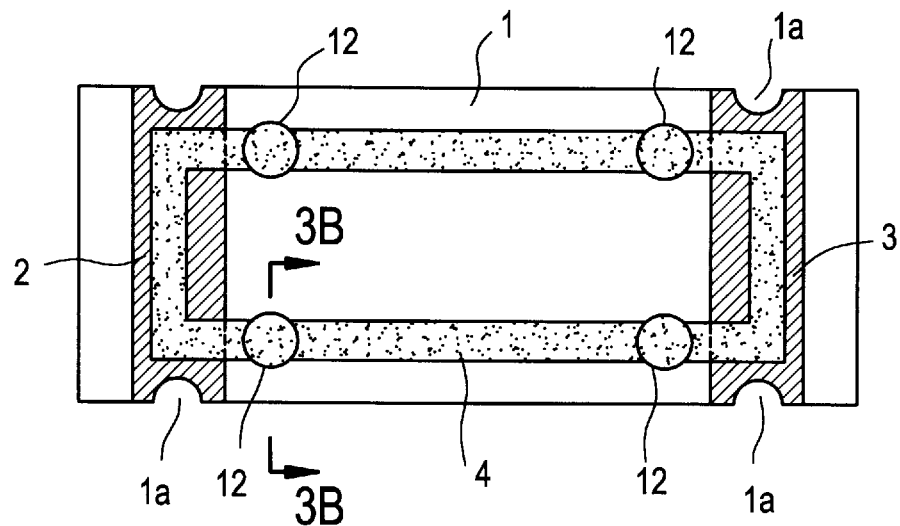
FIG. 2 is a plan view illustrating the substrate shown in FIG. 1.

FIG. 1 shows a surface mount type piezoelectric oscillator A as one example of an electronic component according to a preferred embodiment of the present invention.

A substrate 1 preferably comprises a substantially rectangular sheet which is preferably formed by molding alumina ceramic and which has a thickness of about, for example, 0.3 to 0.7 mm. Of course, the material of the substrate 1 is not limited, and any materials such as dielectric ceramics, glass epoxy, and other suitable materials can be used.

Electrodes 2 and 3 are disposed on the upper surface of the substrate 1 and are preferably formed by a known method such as sputtering, evaporation, printing, plasma spraying or the like. In this preferred embodiment, to provide sufficient bonding strength and solderability, the electrodes 2 and 3 are preferably formed by printing Ag/Pt stoving type conductive paste of 50 $\mu$m and then firing the paste. Both ends of the electrodes 2 and 3 preferably extend to concave through-holes or recesses 1a respectively disposed at the ends of the long sides of the substrate 1, and connected to electrodes disposed on the lower surface of the substrate 1 through the electrodes disposed on the inner surfaces of the through-holes 1a.

An oscillator element 5 is bonded and fixed on the substrate 1 by a material 10 having conductivity and adhesion characteristics, such as a conductive adhesive. As the connecting material 10, for example, solder or a metallic terminal may be used as long as it has a function equivalent to the conductive adhesive. The oscillator element 5 of this preferred embodiment is preferably a thickness shear vibration mode oscillator in which a first electrode 7 extends over a region of about ⅔ of the top surface of the piezoelectric ceramic substrate 6 from one end thereof, and a second electrode 8 extends over a region of about ⅔ on the surface from the other end thereof. However, other oscillators vibrating in other vibration modes may also be used for the oscillator element 5.

Ends of the electrodes 7 and 8 are disposed opposite to each other with the piezoelectric substrate 6 located therebetween preferably at substantially the central portion of the substrate 6 to form a vibration portion. In this preferred embodiment, the other ends of the electrodes 7 and 8 extend to protective layers 9 disposed at both ends of the piezoelectric substrate 6 and are connected to auxiliary electrodes 7a and 8a respectively disposed on the opposite surfaces through end-surface electrodes 7b and 8b, respectively. These end-surface electrodes 7b and 8b are respectively located between the protective layers 9 and the piezoelectric substrate 6.

Both ends of the oscillator element 5 are preferably bonded and fixed to the substrate 1 by the conductive material 10 to electrically connect the electrodes 2 and 3 of the substrate 1 and the electrodes 7 and 8 of the element 5. At this time, the electrode 8 on the bottom surface of the element 5 is connected to the electrode 2 without any material being disposed therebetween, but the electrode 7 on the upper surface is connected to the electrode 3 through the auxiliary electrode 7a. During bonding, it is preferable to provide a slight vibration space between the central portion of the element 5 and the substrate 1.

On the upper surface of the substrate 1, a frame-shaped insulating layer 4 is preferably provided for securing insulation between the electrodes 2 and 3 and a cap 11, which will be described below, and for flattening a step formed by the electrodes 2 and 3. Although, in this preferred embodiment, the insulating layer 4 is preferably formed by baking glass paste, the insulating material is not limited. When an insulating material is used on the cap 11, the insulating layer 4 is not necessarily required.

The opening of the cap 11 is bonded to the insulating layer 4 of the substrate 1 so as to cover the element 5. Although ceramics such as alumina, resin, and metals can be used as the material for the cap 11, in this preferred embodiment, a metallic material press-molded in a shape having a substantially U-shaped cross section is preferably used for decreasing the size of the product and securing dimensional precision. Any metallic material can be selected as long as product strength and adhesion can be obtained, and, for example, an aluminum alloy, nickel silver, 42 Ni alloy can be used.

An adhesive 12 having a high Tg is preferably partially coated on a cap mounting and bonding portion of the substrate 1, particularly, on the insulating layer 4. The adhesive 12 is preferably disposed at a plurality of positions by a method such as printing, pin transfer or dispersion. Although an epoxy adhesive, for example, having a Tg of about 198° C., may be used as the high-Tg adhesive 12, the type of the adhesive used is not limited as long as the adhesive 12 has a sufficient capacity to adhere to a material to be coated and a sufficiently high Tg (150° C. or more) is provided. However, curing conditions are preferably matched with the sealing adhesive 13 described below, or curing is preferably stopped during the course of curing of the sealing adhesive 13. Although the coating area and coating position of the adhesive 12 are not limited, the adhesive 12 is preferably partially coated so as to form a gap for allowing entrance and exit of air when the cap 11 is mounted. In this preferred embodiment, the adhesive 12 is preferably coated at a total of 4 positions on the longer sides of the frame-shaped insulating layer 4. When the cap 11 is mounted on the substrate 11, the cap 11 is slightly pressed, for example, under about 300 gf/cap×0.2 sec, in order to cause the cap 11 to bite into the high-Tg adhesive 12.

The adhesive 12 is preferably simultaneously coated on a plurality of portions on a mother substrate to decrease the number of the steps for coating the adhesive 12 to only a few steps.

Along an entire periphery of the opening of the cap 11, a sealing adhesive 13 is coated by transfer, and the sealing adhesive 13 is bonded to the insulating layer 4 of the substrate 1. For the sealing adhesive 13, a low-Tg adhesive, e.g. Tg is equal to about 50° to about 100° C., having flexibility is preferably used. In this preferred embodiment, an epoxy type heat curable adhesive having a Tg equal to about 80° C. was used, but an epoxy acrylate UV curable adhesive having a Tg equal to about 60° C. has the same function.

After the cap 11 is press-bonded to the substrate 1, the piezoelectric oscillator A is introduced into a curing furnace and then heated in a predetermined temperature profile to cure the adhesives 12 and 13. In heat treatment, since the air in the cap 11 escapes due to expansion by heating, and the cap 11 is moved due to the reaction of the escape of air, the cap 11 is preferably pressed by a jig during curing. When a UV adhesive is used, the adhesive may be cured by irradiation of a predetermined quantity of light in a UV furnace. In this case, unlike heat treatment, there is no respiration, and thus the cap 11 need not be pressed by a jig.

Figure 3A:
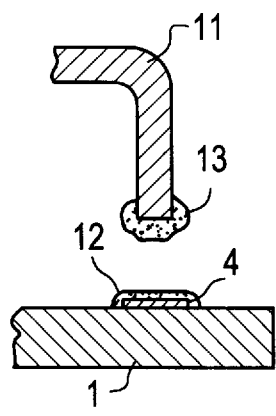
FIGS. 3(a)–3(c) are sectional views taken along line B—B of FIG. 2, illustrating the steps of sealing an electronic component according to preferred embodiments of the present invention.
Figure 3B:
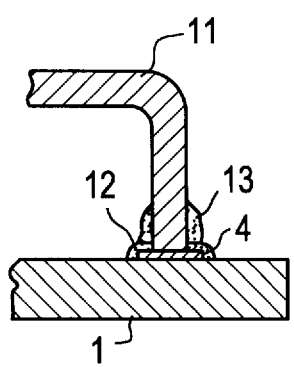
Figure 3C:
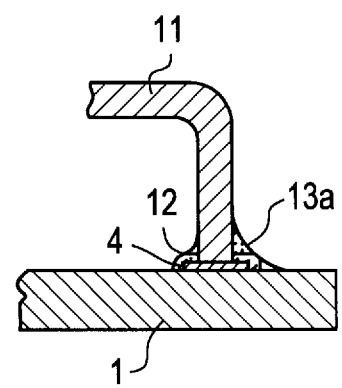

FIGS. 3(a)–3(c) shows a sealing method in another preferred embodiment of the present invention.

FIG. 3(a) shows the state before the cap 11 is mounted in which the insulating layer 4 is disposed on the cap mounting and bonding portion of the substrate 1, and the high-Tg adhesive 12 is partially coated on the insulating layer 4. On the other hand, the low-Tg adhesive 13 is preferably coated over the whole periphery of the opening of the cap 11.

FIG. 3(b) shows a state where the cap 11 is mounted. The high-Tg adhesive 12 previously coated on the substrate 1 rises in a step form due to the thickness thereof. When the cap 11 is press-mounted on the adhesive 12, the low-Tg adhesive 13 coated on the opening of the cap 11 is pushed away toward both sides, and the opening of the cap 11 bites into the high-Tg adhesive 12. At this time, the viscosity of the uncured high-Tg adhesive 12 is lower than that of the uncured low-Tg adhesive 13. As the difference between the viscosities of the uncured adhesives 12, 13 increases, the adhesive 12 is more securely replaced by the adhesive 13. In this preferred embodiment, the viscosities of the uncured high-Tg adhesive 12 and the uncured low-Tg adhesive 13 are about 15,000 cps and 28,000 cps, respectively (25° C., 5 rpm).

FIG. 3(i c) shows the state after the electronic component A is heated. In heating, the adhesives 12 and 13 are heat-cured in the order of the low-glass-transition-point adhesive and the high-glass-transition-point adhesive, and thus the low-Tg adhesive 13 is first decreased in viscosity to form a fillet 13a outside and inside the cap 11 so as to wrap the high-Tg adhesive 12 therein. Therefore, good sealing properties are reliably and securely be obtained. When a UV-curable adhesive is used as the low-Tg adhesive 13, an adhesive having proper viscosity at room temperature is selected so that the fillet 13a can be formed.

When mounting failure is found after the electronic component formed as described above is solder-mounted on the printed substrate, the electronic component is sometimes repaired and re-soldered. In re-soldering, a soldering bit contacts the cap 11 which usually causes deterioration of the sealing properties of the adhesives used to bond the cap to the substrate. However, even if the cap 11 is heated to high temperature, because a sufficiently large adhesive strength is secured by the high-Tg adhesive 12, the cap 11 can be prevented from being shifted or removed. Thus, the sealing properties can be secured by the low-Tg adhesive 13.

The present invention can be applied not only to a piezoelectric oscillator containing an oscillator element in the above-described preferred embodiment, but also to an oscillator with built-in capacitance comprising an oscillator element and a capacitor element, and an oscillator with built-in capacitance comprising a capacitor portion formed on a substrate. The present invention can also be applied to other electronic components such as a filter, a circuit module, etc.

As can be seen from the above description, the preferred embodiments of the present invention use a high-Tg adhesive and a low-Tg adhesive as adhesives for bonding a substrate and a cap, and thus, superior sealing properties are achieved by the low-Tg adhesive in a heat shock test, and shift or removal of the cap is prevented by the high-Tg adhesive even if the temperature is elevated due to contact with a solder bit or the like. Therefore, an electronic component having excellent heat resistance is obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A sealing apparatus for an electronic component including an electronic component element mounted on a substrate and a cap covering the electronic component element, the sealing structure comprising:

a sealing element including at least two different adhesives having different glass transition points, the sealing element being arranged to bond and seal the cap to the substrate.

2. A sealing apparatus for an electronic component according to claim 1, wherein the at least two adhesives include a first adhesive having a high glass transition point and being disposed between the substrate and the cap and a second adhesive having a low glass transition point and being disposed between the substrate and the cap.

3. A sealing apparatus according to claim 2, wherein the first adhesive is partially disposed on a surface of the substrate and the second adhesive is disposed on an entire edge surface of a rim of the cap.

4. A sealing apparatus according to claim 2, wherein the at least two adhesives are arranged in contact with each other.

5. An electronic component comprising:

a substrate;

an electronic component element disposed on the substrate;

a cap disposed on the substrate so as to cover the electronic component element; and a sealing device including at least two different adhesives having different glass transition points, the sealing device being arranged to bond and seal the cap to the substrate.

6. An electronic component according to claim 5, wherein the at least two adhesives include a first adhesive having a high glass transition point and being disposed between the substrate and the cap and a second adhesive having a low glass transition point and being disposed between the substrate and the cap.

7. An electronic component according to claim 6, wherein the first adhesive is partially disposed on a surface of the substrate and the second adhesive is disposed on an entire edge surface of a rim of the cap.

8. An electronic component according to claim 5, wherein the at least two adhesives are arranged in contact with each other.

9. An electronic component according to claim 5, wherein the electronic component element comprises one of a piezoelectric oscillator and a piezoelectric filter.

10. An electronic component according to claim 5, further comprising a frame-shaped insulating layer disposed between the substrate and the electronic component element.

* * * * *